United States Patent [19]
Wert et al.

[11] Patent Number: 6,127,848
[45] Date of Patent: Oct. 3, 2000

[54] VOLTAGE TRANSLATOR WITH GATE OXIDE BREAKDOWN PROTECTION

[75] Inventors: Joseph D. Wert, Arlington; Richard L. Duncan, Bedford, both of Tex.

[73] Assignee: National Semiconductor Corporation, Santa Clara, Calif.

[21] Appl. No.: 09/120,007

[22] Filed: Jul. 20, 1998

[51] Int. Cl.[7] .............................................. H03K 19/0175
[52] U.S. Cl. .................................................. 326/81; 326/83
[58] Field of Search .................................. 326/68, 80, 81, 326/83, 86, 121

[56] References Cited

U.S. PATENT DOCUMENTS

| 5,406,140 | 4/1995 | Wert et al. | 326/68 |
| 5,534,795 | 7/1996 | Wert et al. | 326/81 |
| 5,559,464 | 9/1996 | Orii et al. | 327/333 |
| 5,568,065 | 10/1996 | Wert et al. | 326/33 |

*Primary Examiner*—Michael Tokar
*Assistant Examiner*—Anh Tran
*Attorney, Agent, or Firm*—Skjerven Morrill MacPherson Franklin & Friel LLP; Edward C. Kwok

[57] ABSTRACT

A circuit for voltage translation includes protection against gate oxide breakdown when translating a lower voltage signal into a higher voltage signal. An input signal inverter circuit inverts the lower voltage signal into an intermediate signal having an increased minimum value. By raising the maximum value of the intermediate signal to the voltage level of the higher voltage signal, an output signal inverter circuit produces a driving signal to drive an output stage. However, because the increased minimum value of the signal is maintained, the gate oxide breakdown voltage is not exceeded in the circuit. The circuit also includes a blocking transistor between the input signal inverter and the output signal inverter to prevent the larger driving signal from overloading the input inverter circuit.

8 Claims, 1 Drawing Sheet

VOLTAGE TRANSLATOR WITH GATE OXIDE BREAKDOWN PROTECTION

BACKGROUND OF THE INVENTION

1. Field of the Invention

The present invention relates to systems in which different modules accept different voltage levels, and more particularly, to a voltage translator that includes gate oxide breakdown protection.

2. Discussion of the Related Art

Many modern systems combine modules accepting different voltage levels. For example, in a laptop computer, processor modules powered by a 3.3 V voltage are combined with disk drives powered by a 5.0 V voltage. In order to translate the signal produced by a 3.3 V module to a level acceptable by a 5.0 V module, a simple CMOS inverter powered by 5.0 V can be used. However, such a configuration consumes excessive power during normal operation and can also allow a leakage path to form between the signal bus and the 3.3 V power supply when the bus is driven by the 5.0 V module. U.S. Pat. Nos. 5,406,140 and 5,534,795, issued Apr. 11, 1995 and Jul. 9, 1996, respectively, to Wert et al., describe a low power-consumption voltage translator providing protection against such reverse charge leakage when a voltage on a bus is larger than a power supply voltage of a module connected to the bus. To provide an interface between a module powered by a first power supply voltage and a second module powered by a larger second power supply voltage, the voltage translator of Wert et al. requires the use of both power supply voltages. The maximum allowable voltage drop across a gate oxide in the circuit is limited by the devices using first power supply voltage. However, in the invention of Wert et al., a maximum voltage drop equal to the second power supply voltage can be created across the gate oxide of a device in the voltage translator, which can lead to gate oxide breakdown.

Accordingly, it is desirable to provide an efficient voltage translator that prevents reverse charge leakage while limiting the maximum voltage that appears across its gate oxide.

SUMMARY OF THE INVENTION

The present invention provides a circuit for translating an input signal at a first power supply voltage VDD into an output signal at a larger second power supply voltage VDDIO, without exceeding a specified breakdown voltage VBD across any of the gate oxides of its internal devices. An embodiment of the present invention includes an output stage including a PMOS upper driver transistor and a NMOS lower driver transistor configured as a complementary pair between the second power supply voltage and ground potential for providing the output signal. A lower buffer circuit includes a NMOS buffer transistor having its gate coupled to voltage VDD to limit the voltage seen by the NMOS lower driver transistor. Similarly, an upper buffer circuit includes a PMOS buffer transistor that raises any 0 V (i.e. LOW) output signal a discrete amount in order to keep the maximum voltage across the gate oxide of the PMOS upper driver transistor less than breakdown voltage Vbd.

An embodiment of the present invention further includes an upper signal inverter to convert the input signal at voltage VDD into a driving signal at voltage VDDIO to provide full function of the PMOS upper driver transistor. An input inverter circuit includes an input buffer circuit to adjust the driving signal to keep it at least a specified offset voltage above ground at all times. An output inverter circuit converts the signal from the input buffer circuit into a driving signal at voltage VDDIO. An implementation of the output inverter circuit includes an output signal transistor to generate the driving signal, an inverting pair to provide a control signal for the output signal transistor, and a output buffer circuit to keep the control signal at least a specified offset voltage above ground potential at all times.

An embodiment of the present invention further includes a gating circuit to prevent signals from the output inverter circuit at voltage VDDIO from overloading the input inverter circuit. An implementation of the gating circuit of the present invention includes a NMOS transistor having its gate coupled to voltage VDD, in order to limit the maximum voltage that can be transmitted through the gating circuit.

The present invention will be better understood upon consideration of the accompanying drawings and the detailed description below.

BRIEF DESCRIPTION OF THE DRAWINGS

The FIGURE shows an embodiment of a voltage translator of the present invention.

DETAILED DESCRIPTION

Figure 1:
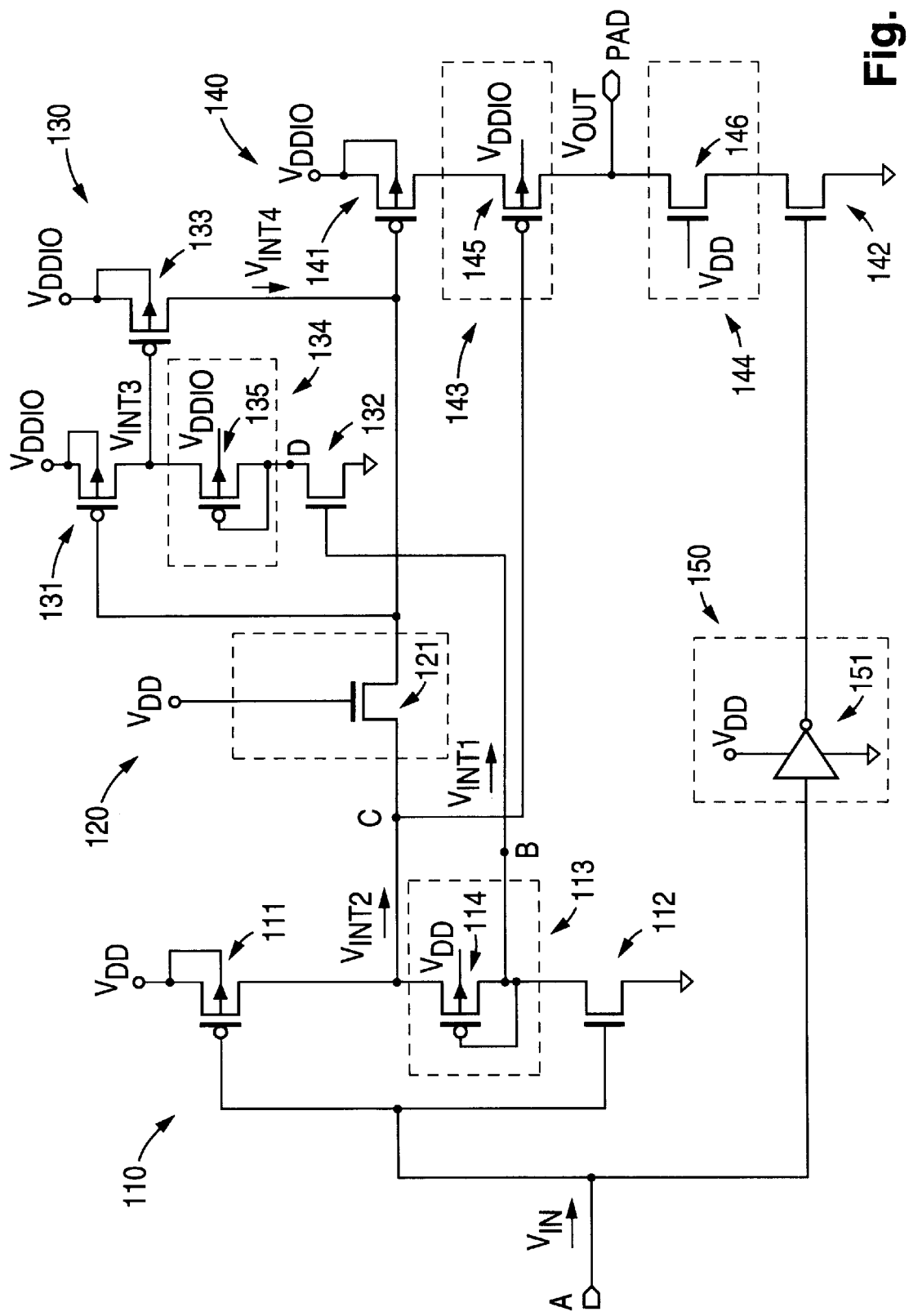

The present invention provides a voltage translator for a first module powered by a first supply voltage VDD that prevents reverse charge leakage and gate oxide breakdown when interfacing with a second module powered by a second power supply voltage VDDIO that is larger than voltage VDD. The FIGURE shows a diagram of an implementation of the present invention for a module where voltage VDD=2.5 V, voltage VDDIO=3.3 V, and lower supply voltage VSS=0 V. (Other power supply voltages can be accommodated with slight modifications to the circuit.) The voltage differential between a gate and drain or a gate and source are be kept below a breakdown voltage Vb=3.25 V. Since voltage VDD and VDDIO can vary by as much as 10% during normal operation, excessive gate oxide voltages would be likely to develop in a conventional system using both 2.5 V and 3.3 V devices. In the embodiment of the present invention shown in the FIGURE, an input signal Vin switching between voltage VSS and voltage VDD is converted into an output signal Vout that switches between voltage VSS and voltage VDDIO, while all gate oxide voltages are maintained below 3.25 V.

Output signal Vout is generated by an output stage 140, as shown in the FIGURE. An upper driver transistor 141 and a lower driver transistor 142 are connected in series as a complementary pair between voltage VDDIO and ground potential. The backgate and source of transistor 141 is coupled to voltage VDDIO. The backgates of all NMOS transistors in the FIGURE are tied to ground potential. An output terminal PAD is connected between transistors 141 and 142 to provide signal Vout. Buffer circuits 143 and 144 prevent gate oxide breakdown voltages from developing in transistors 141 and 142, respectively. As shown in the FIGURE, circuit 143 can be implemented by a PMOS transistor 145 coupled between transistor 141 and output terminal PAD. The backgate of transistor 145 is tied to voltage VDDIO and the gate of transistor 145 is driven by a signal Vint2. As shown in the FIGURE, circuit 143 can be implemented by an NMOS transistor 146 having its gate tied to voltage VDD.

Input signal Vin is received at a data terminal A and is sent to an upper input inverter 110 and a lower inverter 150. Inverter 110 includes an upper input transistor 111 and a lower input transistor 112 serially coupled in an inverting configuration between voltage VDD and ground potential. An input buffer circuit 113 is connected between transistor 111 and transistor 112 to adjust the output of inverter 110. In the depicted implementation of the present invention, circuit 113 includes a PMOS buffer transistor 114 having its gate coupled to its drain and its backgate coupled to voltage VDD. (Transistor 114 can also be implemented by an NMOS transistor). When signal Vin is at voltage VDD, transistor 112 is turned fully on, forcing node B to ground potential. At the same time, because transistor 114 is gate-drain coupled, node C is raised to an offset voltage Vtp, where Vtp is the threshold voltage of a PMOS transistor. (If transistor 114 is an NMOS transistor, node C is raised to an offset voltage Vtn, where Vtn is the threshold voltage of an NMOS transistor.) When signal Vin swings to 0 V, transistor 112 turns off and transistor 111 turns on, pulling node C up to voltage VDD. Transistor 114 then drops the voltage at node B to a reduced voltage Vred, which is defined by:

Vred=VDD−Vtp

The voltages at nodes B and C provide intermediate signals Vint1 and Vint2, respectively. Meanwhile, lower inverter 150 inverts signal Vin.

Signals Vint1 and Vint2 are received by an upper output inverter 130. Inverter 130 includes an upper output transistor 131 and a lower output transistor 132 serially coupled in an inverting configuration between voltage VDDIO and ground potential. Transistor 131 is backgate and source-coupled to voltage VDDIO. An output buffer circuit 134 is connected between transistor 131 and transistor 132 to adjust a control signal Vint3 used to drive an output signal transistor 133, which is backgate and source-coupled to voltage VDDIO. In the depicted implementation of the present invention, circuit 134 includes a PMOS buffer transistor 135 having its gate coupled to its drain and its backgate coupled to voltage VDDIO.

A gating circuit 120 is connected between inverter 110 and inverter 130 to prevent voltages generated by inverter 130 from overloading the devices in inverter 110. As shown in the FIGURE, circuit 120 can be implemented by an NMOS transistor 121 serially coupled between inverters 110 and 130. The gate of transistor 121 is tied to voltage VDD.

When signal Vin is at voltage VDD, node B is forced to ground potential and node C is raised to an offset voltage Vtp. The threshold voltage of a PMOS transistor can be in the 400–700 mV range, so that voltage Vtp can bee low enough to turn both transistors 141 and 145 fully on, providing voltage VDDIO to output terminal PAD. However, voltage Vtp also reduces the voltage differential across the gate oxide for transistors 141 and 145 enough so that both remain below breakdown voltage VBD. Meanwhile, input signal Vin at voltage VDD is inverted to ground potential by lower inverter 150, turning transistor 142 completely off. Transistor 142 is protected from voltage VDDIO at output terminal PAD by transistor 146. As soon as the voltage at output terminal PAD is pulled above VDD−Vtn, where Vtn is the threshold voltage of a NMOS transistor, transistor 146 turns off, isolating transistor 142 from terminal PAD. Since the gate of transistor 146 is tied to voltage VDD, the voltage across the gate oxide of transistor 146 remains lower than breakdown voltage Vb. In this manner, a signal Vin at voltage VDD is translated into a signal Vout at voltage VDDIO without violating the breakdown voltage limit.

When input signal Vin is at ground potential, node C is raised to voltage VDD. Transistor 114 then drops the voltage at node B to a reduced voltage Vred, which is defined by:

Vred=VDD−Vtp

Voltage Vred at node B turns on transistor 132 in output voltage inverter 130, pulling node D to ground potential. Transistor 135 therefore charges the gate of transistor 133 to voltage Vtp. Voltage Vtp turns transistor 133 fully on, but prevents the voltage differential across the gate oxide of transistor 133 from exceeding breakdown voltage VBD. Transistor 133 provides voltage VDDIO to the gate of transistor 141, turning it fully off. When the voltage at the gate of transistor 141 is pulled above voltage VDD−Vtn, transistor 121 turns off, isolating and protecting inverter 110 from the high voltage on the gate of transistor 141. At the same time, voltage VDD at node C turns transistor 145 off, isolating transistor 141 from the ground potential voltage at output terminal PAD. Meanwhile, inverter 150 applies voltage VDD to the gate of transistor 142. This turns on transistor 142 and pulls output terminal PAD down to ground potential. In this manner, a signal Vin at 0 V is transmitted as a signal Vout at 0 V without violating the gate oxide breakdown voltage limit.

While a preferred embodiment of the present invention has been described in detail, other embodiments and variations are within the scope of the invention. In particular, the invention is not limited by particular voltage values. Through device size and quantity modifications in buffer circuits 113, 134, 143, and 144, various combinations of voltages VDD, VDDIO, and VSS can be used.

We claim:

1. A circuit for translating an input signal having a value switching between a reference voltage and a first power supply voltage into an output signal having a value switching between said reference voltage and a second power supply voltage, said second power supply voltage being larger than said first power supply voltage, while keeping all voltages across the gate oxides of the devices in said circuit less than a specified breakdown voltage, said circuit comprising:

(i) a first power terminal for receiving said first power supply voltage;

(ii) a second power terminal for receiving said second power supply voltage;

(iii) a ground terminal for receiving said reference voltage;

(iv) an input terminal for receiving said input signal;

(v) an output stage for generating said output signal, said output stage including:

(a) an upper driver transistor and a lower driver transistor connected in series as a complementary pair, said upper driver transistor being coupled to said second power terminal and said lower driver transistor being coupled to said ground terminal;

(b) an output terminal connected between said upper driver transistor and said lower driver transistor to provide said output signal;

(c) an upper buffer circuit to keep the voltage across the gate oxide of said upper driver transistor below said specified breakdown voltage; and (d) a lower buffer circuit to keep the voltage across the gate oxide of said lower driver transistor below said specified breakdown voltage;

(vi) an upper signal inverter for converting said input signal into an upper driving signal switching between a first offset voltage and said second power supply voltage to turn on and turn off, respectively, said upper driver transistor, said first offset voltage being equal to the sum of said reference voltage and a first defined offset voltage, said upper signal inverter comprising:

(a) an upper input inverter for inverting said input signal into a first intermediate signal, and creating a second intermediate signal by reducing the range of said first intermediate signal; and (b) an upper output inverter for converting said first intermediate signal and said second intermediate signal into said upper driving signal;

(vii) a lower signal inverter for inverting said input signal into a lower driving signal to drive said lower driver transistor; and (viii) a gating circuit connected between said upper input inverter and said upper output inverter to prevent said upper driving signal from appearing at said upper input inverter.

2. The circuit of claim 1 wherein said upper buffer circuit comprises an upper buffer transistor serially connected between said upper driver transistor and said output terminal, the gate terminal of said upper buffer transistor being driven by said second intermediate signal so that:

when said input signal is at said first power supply voltage, said upper buffer transistor is fully on; and when said input signal is at said reference voltage, said upper buffer transistor is turned off.

3. The circuit of claim 2 wherein said lower buffer circuit comprises a lower buffer transistor serially connected between said lower driver transistor and said output terminal, the gate of said lower buffer transistor being driven by said first power supply voltage.

4. The circuit of claim 1 wherein said upper input inverter comprises:

an upper input transistor and a lower input transistor serially coupled in an inverting configuration between said first power terminal and said ground terminal to generate said first intermediate signal, the backgate of said upper input transistor being coupled to said first power terminal and said first intermediate signal switching between said first power supply voltage and said reference voltage;

a first intermediate output terminal connected between said upper input transistor and said lower input transistor to provide said first intermediate signal; and an input buffer circuit for limiting the range of said first intermediate signal to generate said second intermediate signal switching between said first power supply voltage and said first offset voltage.

5. The circuit of claim 4 wherein said input buffer circuit comprises:

a input buffer transistor connected between said upper input transistor and said first intermediate output terminal, the backgate of said input buffer transistor being coupled to said first power terminal and the gate of said input buffer transistor being drain-coupled; and a second intermediate output terminal connected between said upper input transistor and said input buffer transistor to provide said second intermediate signal.

6. The circuit of claim 4 wherein upper output inverter comprises:

an inverting pair comprising an upper output transistor, the backgate of said upper output transistor being coupled to said second power terminal, and a lower output transistor serially coupled in an inverting configuration between said second power terminal and said ground terminal, the gate of said upper output transistor being driven by said second intermediate signal, and the gate of said lower output transistor being driven by said first intermediate signal;

an output buffer circuit for limiting the range of the output of said inverting pair and providing a third intermediate signal switching between a second offset voltage and said second power supply voltage, said second offset voltage being equal to the sum of said reference voltage and a second defined offset voltage;

an output signal transistor, the backgate of said output signal transistor being tied to said second power terminal and the gate of said output signal transistor being driven by said third intermediate signal so that:

when said input signal is equal to said first reference voltage, said upper driving signal is equal to said second power supply voltage; and when said input signal is equal to said power supply voltage, said upper driving signal is equal to said first offset voltage.

7. The circuit of claim 6 wherein said output buffer circuit comprises:

a output buffer transistor connected between said upper output transistor and said lower output transistor, the backgate of said output buffer transistor being coupled to said second power terminal and the gate of said input buffer transistor being drain-coupled; and a third intermediate output terminal connected between said upper output transistor and said output buffer transistor to provide said third intermediate signal.

8. The circuit of claim 1 wherein said gating circuit comprises an n-type transistor, the gate of said n-type transistor being coupled to said first power terminal.

* * * * *